United States Patent [19]

Horiuchi et al.

[11] Patent Number: 4,769,686
[45] Date of Patent: Sep. 6, 1988

[54] SEMICONDUCTOR DEVICE

[75] Inventors: Masatada Horiuchi, Koganei; Ken Yamaguchi, Higashikurume, both of Japan

[73] Assignee: Hitachi, Ltd., Tokyo, Japan

[21] Appl. No.: 63,785

[22] Filed: Jun. 19, 1987

Related U.S. Application Data

[63] Continuation of Ser. No. 595,410, Mar. 30, 1984, abandoned.

[30] Foreign Application Priority Data

Apr. 1, 1983 [JP] Japan .................................. 58-55075
Jul. 4, 1983 [JP] Japan ................................58-1211985

[51] Int. Cl.$^4$ ......................................... H01L 29/78
[52] U.S. Cl. .................................. 357/23.8; 357/23.3; 357/23.9; 357/42; 357/43; 357/67; 357/71
[58] Field of Search .................... 357/23.3, 23.8, 23.9, 357/42, 43, 67 S, 71 S

[56] References Cited

U.S. PATENT DOCUMENTS

| | | | |
|---|---|---|---|
| 3,590,471 | 7/1971 | Lepselter | 29/571 |
| 4,005,450 | 1/1977 | Yoshida et al. | 357/23 |
| 4,141,022 | 2/1979 | Sigg et al. | 357/67 S |
| 4,339,869 | 7/1982 | Reihl et al. | 357/67 S |
| 4,374,700 | 2/1983 | Scott et al. | 357/67 S |
| 4,384,301 | 5/1983 | Tasch, Jr. et al. | 357/23.9 |
| 4,458,410 | 7/1984 | Sugaki et al. | 357/71 S |

FOREIGN PATENT DOCUMENTS

| | | | |
|---|---|---|---|
| 55-143068 | 11/1980 | Japan | 357/23.8 |
| 1370739 | 10/1974 | United Kingdom | 357/23 |

OTHER PUBLICATIONS

IBM Tech. Dis. Bul., vol. 23, No. 12, May 1981, Critchlow et al. pp. 5355.
IBM Tech. Dis. Bul., vol. 24, No. 1A, Jun. 1981, Jambotkar pp. 57-60.
Okabe, "A Complimentary-Pair of High Power Mosfets" 1977 IEDM pp. 416-419.
Rodriguez et al., "Fabrication of Short Channel . . ." Solid State Electronics 1976, vol. 19, No. 1 pp. 17-21.

Primary Examiner—Edward J. Wojciechowicz
Attorney, Agent, or Firm—Antonelli, Terry & Wands

[57] ABSTRACT

Herein disclosed is a semiconductor device, especially, an MISFET which can ensure a high breakdown voltage and operate at a high speed. The semiconductor device according to the present invention reduces the sheet resistance by using an impurity region, which has an impurity concentration not exceeding $10^{20}$ cm$^{-3}$, in a drain or source region and by forming a metal silicide layer on the surface of the impurity region. Moreover, the semiconductor device of the present invention is constructed such that the impurity concentration of an n-type drain or source region does not exceed $10^{20}$ cm$^{-3}$ whereas the impurity concentration of a p-type drain or source region does not exceed $10^{19}$ cm$^{-3}$ and such that at least one portion of the drain or source region is made of a metal silicide so that it can effectively protect the latch-up phenomenon which is caused when two or more semiconductor devices of different conductive type are integrated.

22 Claims, 9 Drawing Sheets

SEMICONDUCTOR DEVICE

This application is a continuation application of application Ser. No. 595,410, filed Mar. 30, 1984 now abandoned.

BACKGROUND OF THE INVENTION

1. Field of the Invention

The present invention relates to a metal-insulator-semiconductor field effect transistor (which will be referred to as a "MISFET") and, more particularly, to a MISFET which is suitable for raising the breakdown voltage of a sub-micron-channel-length MISFET and which is excellently free from any degradation even with hot carrier injection. On the other hand, the present invention relates to a complementary metal-oxide-semiconductor-field effect transistor (which will be referred to as a "CMOSFET") and, more particularly, to a submicron-channel-length CMOSFET of high breakdown voltage, which can operate with a power supply of 5 V even in a gate length equal to or less than 0.5 µm.

2. Description of the Prior Art

In order to reduce the channel length of the MISFET, it is the present practice to make a gate insulator thin, a source-drain distance small, and a source-drain junction shallow. As a result of this tendency, the maximum problem of the MISFET at present is a drop of a source-drain breakdown voltage. The drop of the so-called "punch-through voltage", which is caused as a result that a depletion layer extending from the drain side reaches the source region can be obviated by increasing the substrate doping concentration. This in turn decreases the avalanche breakdown voltage. Especially, the avalanche breakdown voltage (which will be referred to as "BVDS") for the zero bias of the gate, the source and the substrate drops far more than a breakdown voltage of intrinsic p-n junction because increase in the surface potential is suppressed by the gate voltage. As a result, the source-drain breakdown voltage of the MISFET of short channel length, which has a channel length of 1µm, a gate oxide thickness of 20 nm and a source-drain junction depth of 0.35 µm, is dropped to about 6 V, which is generally equal of an ordinary power supply voltage of 5 V. The transistor of short channel length described in the above is easily broken by the fluctuations in the power supply voltage. In the conventional MISFET of short channel length, in order to eliminate the above defect, there has been adopted the so-called "double diffused drain structure" in which are combined a highly concentrated diffusion layer having a shallow junction depth of about 0.2 µm and a low concentrated diffusion layer having a larger junction depth of about 0.35 µm. Thanks to the above structure, the BV$_{DS}$ value can be improved by about 1.5 to 2 V. As a result, the improved MISFET of short channel length according to the prior art can be usually obviated from being broken by the fluctuations in the power supply voltage. However, the above improved MISFET of small channel length has not been satisfied yet from the standpoint of reliability. In a long-term operation under a normal condition, more specifically, hot carriers are injected into a gate insulator by the high field crowding near the drain thereby to invite degradations such as fluctuations in the threshold voltage, increase in the surface state density, or reduction in the transconductance.

The description thus far made is directed to the MISFET element but can be substantially similarly applied to the structure of the CMOS which is constructed by combining two or more transistors. On the other hand, the CMOS has the following problems.

Here, the CMOS is a structure, in which a p-channel MOS (which will be referred to as a "PMOS") and an n-channel MOS (which will be referred to as a "NMOS") are coupled and formed on a common chip.

FIG. 1 is a sectional view showing the construction of the conventional CMOS having a gate length equal to or more than 2 µm.

In FIG. 1, reference numeral 21 indicates an n-conductive type semiconductor substrate, and numeral 22 indicates a p-conductive type diffusion region which is formed in the semiconductor substrate 21 and which is called a "well". Numeral 23 indicates a field oxide, and numerals 24 and 25 indicate source and drain diffusion regions of the NMOS, which are formed in the well 22 and which are of n-conductive type having a maximum surface concentration equal to or more than $10^{20}$ cm$^{-3}$. Numerals 26 and 27 indicate source and drain diffusion regions of the PMOS, which are of p-conductive type having a maximum surface concentration equal to or more than $10^{19}$ cm$^{-3}$. Numerals 28 and 29 indicate a gate insulator and a gate electrode, respectively. Numerals 210 and 211 indicate a passivation film and a source or drain electrode, respectively.

The CMOSFET of the prior art construction having such a profiled drain structure has a variety of defects as the elements becomes minute:

(i) Drop of Source-Drain Breakdown Voltage

Since the channel length decreased as the element becomes minute, the punch-through breakdown voltage drops. The improvement of the punch-through breakdown voltage can be achieved by increasing the substrate doping concentration, which adversely decreases the avalanche breakdown voltage. The remarkably miniaturized NMOS having a channel length equal to or less than 0.3 µm cannot operate at the ordinary power supply voltage of 5 V because the source-drain breakdown voltage remarkably drops to 2 V or less.

Incidentally, if the substrate doping concentration is increased so as to improve the punch-through breakdown voltage, the high speed operation obtained by the small size of the MISFET is obstructed because that increase is followed by the reduction in the channel conductance.

(ii) Breakdown of MISFET by Latch-up

The primary defect of the CMOSFET having the conventional structure is the breakdown of the MISFET on the basis of the thyristor operation which is called a "latch-up". These latch-up phenomena become prominent as the CMOSFET becomes minute. In the CMOSFET having a shortened distance between the NMOS and the PMOS, more specifically, a parasitic thyristor having an NPNP structure is formed among the drain 25, the well 22 and the semiconductor substrate 21 of the NMOS, and the source 26 or the drain 27 of the PMOS. The parasitic thyristor is triggered by application of an excess power supply, by generation of an internal transient excess power during the normal operation or by induction of minority carriers upon irradiation of optical or radioactive rays, and the thyristor operation cannot be suppressed until the power supply is stopped. In response to this thyristor operation, an excess current flows through the CMOSFET so that the FET is broken.

The above thyristor operation is caused, as is known in the art, by the fact that the distance between the well 22 and the PMOS becomes the shorter as the CMOSFET becomes the more minute so that the product of the current gains of the parasitic PNP bipolar transistor and the parasitic NP bipolar transistor exceeds 1.

There has been proposed a method for blocking the thyristor operation by decreasing the current gain product of the parasitic bipolar transistors. Moreover, the structure of the CMOSFET, in which the source 26 and drain 27 of the PMOS of the prior art PMOS of the p+n junction shown in FIG. 1 are replaced by a Schottky junction, is described on page 262 of Proceedings of International Electron Devices Meeting, 1982. In the Report entitled "CMOS latch-up elimination using Schottky barrier PMOS" in the above Proceedings, the latch-up phenomena are eliminated by dropping the current gain of the parasitic PNP bipolar transistor to one hundredth or less than that of the prior art structure using the p+n junction by employing the fact that the minority carrier injection efficiency of the Schottky junction is far lower than that of the p+n junction.

The CMOSFET, in which the source junction and the drain junction are formed by the Schottky junction in place of the p+n junction, can eliminate the latch-up phenomena but still has the defect which is intrinsic to the Schottky junction. More specifically, the CMOSFET using the Schottky junction cannot ensure a sufficient current, because it has a high drain junction leakage current and a non-linear output and cannot have a good ohmic contact and because it has a low transconductance, so that it has a variety of defects including one that it cannot enjoy a high speed operation.

The above defects based upon the Schottky junction can be eliminated by the "lightly doped Schottky MOSFET" which has been proposed later (on page 466 of Proceedings of International Electron Devices Meeting, 1982). In this Schottky transistor, more specifically, if the Schottky junction is formed on a low impurity concentrated drain region, the leakage current of the drain junction can be reduced, and the transconductance can also be made to resemble that of the PMOS of the ordinary structure.

However, the method of constructing the CMOSFET by the structure in which the lightly doped drain diffusion layer and the Schottky junction are combined has the following defects. As is also described in the Report entitled "CMOS latch-up elimination using Schottky barrier PMOS", the current gain of the parasitic NPN bipolar transistor in case the source junction and the drain junction of the NMOS are formed by the Schottky junction is increased to ten times at the maximum as high as the current gain of the parasitic NPN bipolar transistor which has the prior art structure formed of the drain junction by the n+p junction. Therefore, the CMOS transistor, in which the PMOS and the NMOS are formed of the Schottky junction irrespective of whether or not the lightly doped drain diffusion layer is present, has a defect that it is more liable to experience the latch-up phenomena than the CMOS transistor in which the source junction and the drain junction of the PMOS are made of the Schottky junction and in which the respective junctions of the NMOS are made of the usual n+p junctions.

According to the foregoing two papers concerning the prevention of the latch-up by the Schottky junction, the construction of the CMOS transistor by combining the PMOS, in which the Schottky barrier is formed on each surface of the source and drain regions having a low impurity concentration distribution, and the NMOS, in which the highly doped source and drain diffusion layers are formed, as usual, is the most desirable from the standpoint of preventing the latch-up.

However, the conclusion obtained from the foregoing two papers and from their combination is supported only from the standpoint of preventing the latch-up of the CMOSFET but does not propose any solution for the defects concerning the drop of the breakdown voltage of the NMOS and PMOS according to the short channel length of the CMOSFET.

As to the sub-micron-channel-length CMOSFET having the channel length equal to or less than 0.5 μm, the above two papers have no description and provide no useful information for the defects.

SUMMARY OF THE INVENTION

An object of the present invention is to provide a sub-micron-channel-length MISFET which has a sufficiently higher source-drain breakdown voltage than a ordinary supply voltage and which is free from any degradation based upon the hot carrier injection.

Another object of the present invention is to provide a CMOSFET which is free from any of the defects of the prior art and which is enabled to operate at an ordinary power supply voltage even in a remarkably short channel length and to prevent the latch-up phenomena.

The present invention is based upon the analyzed results which have been made in the investigation of the most proper condition of a double diffused drain structure of the prior art while noting the role played by a highly doped region having a shallow junction depth. FIG. 2A is a sectional view showing the MISFET having the double diffused drain structure of the prior art. In FIG. 2A, reference numerals 1, 2 and 3 indicate a p-type semiconductor substrate; a field oxide and a gate oxide, respectively. Of numerals 5 to 8 indicating n-type diffused layers formed by using a gate electrode 4 as a diffusion mask, numerals 5 and 7 indicate drain diffusion layers, and numerals 6 and 8 indicate source diffusion layers. Here, the layers 5 and 6 are the low concentrated diffusion layers which have a surface impurity concentration $C_{s2}$ and a junction depth $X_{j2}$. The layers 7 and 8 are the highly concentrated layers which have a surface impurity concentration $C_{s1}$ and a junction depth $X_{j1}$. FIG. 2B presents the representative results of both the impurity concentration distribution and the electric field which are plotted against the distance from the drain junction edge to the source junction edge on the substrate surface of the MISFET of FIG. 2A. FIG. 2B corresponds to the case in which an effective channel length is 1.1 μm, in which the thickness of the gate oxide 3 is 20 nm, in which $X_{j1}$ and $X_{j2}$ are 0.25 μm and 0.35 μm, in which $C_{s1}$ and $C_{s2}$ are $1 \times 10^{21}$ cm$^{-3}$ and $1 \times 10^{19}$ cm$^{-3}$, and in which the voltages applied to the gate electrode 4 and the drain electrode 9 are 0 V and 10 V, respectively. In view of FIG. 2B, it can be apparently found that the electric field on the substrate surface is caused to take its maximum in the drain diffusion layers near at an impurity concentration of $10^{18}$ cm$^{-3}$ by the application of a drain voltage and to becomes lower in the drain diffusion layer 7 having a higher impurity concentration. The present invention is based upon the founding of the abruptly dropping tendency of the electric field in the highly concentrated diffusion layer 7 as a result of the analyses. In other words, the result makes it possible to consider that the region 7 in the MISFET of the double diffused drain structure of the prior art has little contribution to raise the breakdown voltage. On the basis of the concept thus far described, it can be considered from the standpoint of the high breakdown voltage of the MISFET of short channel length that the presence of the highly concentrated diffusion layers rather raises an obstruction and that the drain diffusion layers are made of the low concentrated diffusion layers. However, this concept has not been put into practice yet. This is because the prior art has been prejudiced by the fixed concept that the drain diffusion layers should be made of the highly concentrated ones, and has considered the presence of the highly concentrated diffusion layers indispensable for the double diffused drain structure. Reviewing the roles to be played by the highly concentrated diffusion layers 7 and 8 of the double diffused drain structure on the basis of the above standpoint, it is apparent that the regions 7 and 8 do not play any role but retain the good ohmic contact between the electrodes 9 and 10 and reduce the source-drain diffusion resistance. As to the source-drain diffusion resistance, on the other hand, it is known that the sheet resistance of 50$\Omega/\square$ by the ordinary highly concentrated diffusion layers can be reduced to one tenth, i.e., 3$\Omega/\square$ or lower by the prior art of forming a silicide of platinum or the like on the diffusion layers. In the silicide drain structure thus far described, however, the sheet resistance reducing effect is noted, but no investigation from the standpoint of improving the source-drain breakdown voltage has not be made in the prior art. Therefore, the highly concentrated diffusion layer having a surface concentration equal to or higher than $10^{20}$ cm$^{-3}$ is used as the drain diffusion layer on the basis of the fixed concept.

The present invention is based upon the investigated results made while considering that the above fixed concept is nonsense and that it is made possible by optimizing the drain diffusion layer and the impurity distribution to raise the source-drain breakdown voltage, to ensure the good ohmic contact between the drain electrode and the drain diffusion layer, and to reduce the sheet resistance. More specifically, the present invention is based upon the finding of the fact that, if the surface concentration of the drain diffusion layer to be formed with the silicide layer is equal to or higher than $10^{18}$ cm$^{-3}$, a precipitation layer having a surface concentration of about $10^{19}$ cm$^{-3}$ having a thickness of 10 nm can be formed just below the silicide layer to ensure the ohmic contact sufficient for the ordinary operation of the MISFET. The present invention is also based upon the finding of the fact that, if the surface concentration of the drain diffusion layer is equal to or lower than $10^{20}$ cm$^{-3}$, the source-drain breakdown voltage can be made higher by 5 V at the maximum even in the MISFET having an effective channel length of 1 $\mu$m or less than that of the MISFET of the prior art.

The CMOSFET according to the present invention is characterized: in that there are formed in a doped diffusion region an n-type drain region having the maximum surface concentration of $10^{18}$ to $10^{20}$ cm$^{-3}$ and a p-type drain region having the maximum surface concentration of $10^{17}$ to $10^{19}$ cm$^{-3}$; and in that at least one portion of each of said drain regions is junctioned to a layer of either refractory metal or a silicide of said metal.

DESCRIPTION OF THE PREFERRED EMBODIMENTS

Figure 1:
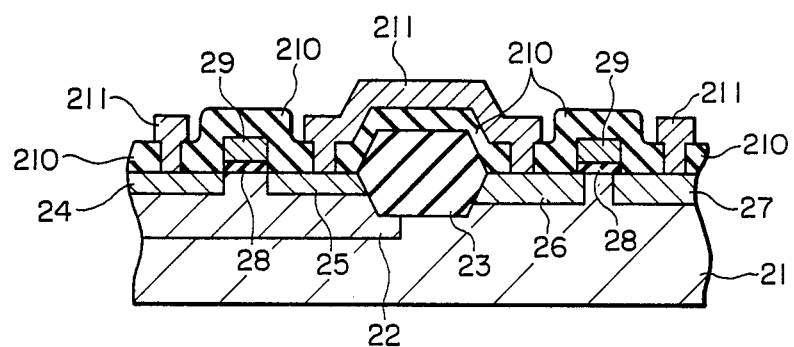
FIG. 1 is a sectional view showing the CMOS of the prior art.

The present invention will be described in more detail in the following in connection with the embodiments thereof. For convenience only, the following description will be made with reference to the accompanying drawings, but care should be taken because essential portions are shown in enlarged scales in the drawings.

EMBODIMENT 1

Figure 4:
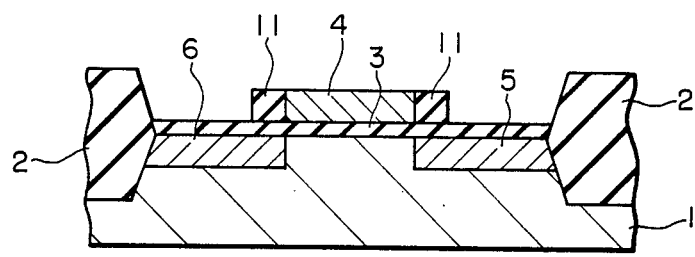
Figure 5:
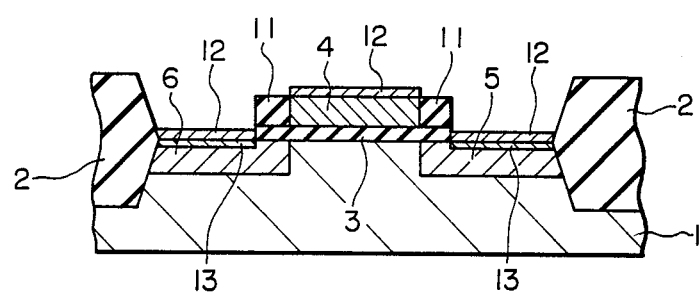
Figure 6:
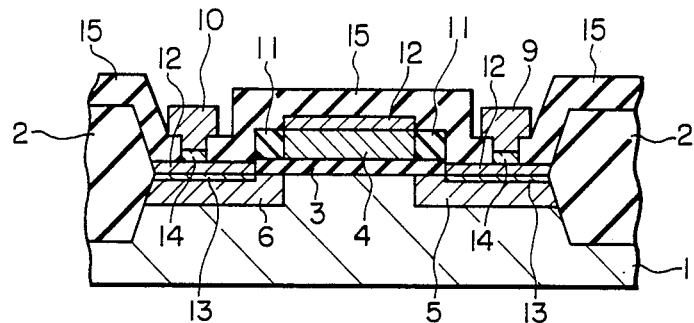

FIGS. 3 to 6 are sectional views showing the fabricating steps in the consecutive order in accordance with the first embodiment of the MISFET of the present invention. Indicated a reference numeral 1 is a silicon substrate of p-conductive type having a specific resistance of 1 $\Omega$.cm. The semiconductor substrate 1 is selectively forme with a thick field oxide 2 having a thickness of 0.8 $\mu$m by making use of the conventional isolation technique. After that, the substrate surface has its active region exposed to the outside to form a clean gate oxide 3 having a thickness of 20 nm. After that, the gate oxide 3 is formed thereon with a silicon film having a thickness of about 0.3 $\mu$m, into which phosphorous is diffused in high concentration by the thermal diffusion using POCl$_3$ as a source. After that, a gate electrode 4 is formed by the lithography. The channel length after the lithography is 1 $\mu$m. Next, silicon oxide 11 having a thickness of 0.5 $\mu$m is deposited all over the surface by the chemical vapor deposition using tetraethoxysilane ($Si(OC_2H_5)_4$). The deposited film 11 is anisotropically etched in the direction normal to the surface of the semiconductor substrate by the reactive sputter etching thereby to remove the silicon oxide deposited on the flat portion. Then, the silicon oxide 11 is left only on the side wall of the gate electrodes 4, as shown in FIG. 4. Then, arsenic is injected into the semiconductor substrate 1 through the oxide layer 5 by the ion implantation technique under the acceleration energy of 70 KeV. This condition is for ensuring maximum impurity concentration on the substrate surface. In the present embodiment, a number of MISFETs are so fabricated by using the implantation dose as variable that the surface impurity concentration takes various values within a range of $1 \times 10^{17}$ to $10^{20}$ cm$^{-3}$. After the ion implantation, the injected ions are annealed and activated. The annealing step thus far described is conducted at 1,000° C., but annealing times are so set for the respective MISFETs having various implantation dose that the junction depth $X_j$ may be 0.25 μm. After that, the gate oxide 3 lying on the drain diffusion layer 3 and the source diffusion layer 6 is removed and is evaporated all over surface with platinum (Pt) having a thickness of 50 μm by the sputtering process. Next, an annealing process at 450° C. is conducted to form platinum silicide (PtSi) 12 on the surface of the drain and source diffusion layers 5 and 6 and on the surface of the gate electrode 4. In the annealing process, no reaction with silicon is caused on the oxides 11 and 2 to produce no silicide. As a result, an etching process is conducted with aqua regia after the annealing step. Since the PtSi is not etched by the aqua regia, only the unreacted Pt is removed to leave the PtSi in self-alignment only on the respective surfaces of the gate electrode 4, the drain diffusion layer 5 and the source diffusion layer 6. Here, just below the PtSi layer 12, there is formed such a segregated layer 13 in a self-alignment with the PtSi layer 12 as has a thickness of about 10 nm and as has an impurity concentration of one order higher than the surface impurity concentration before the PtSi layer is formed. The depthwise impurity distribution in the segregated layer 13 has a downward bulging curve against the depth. After the formation of the PtSi layer 12, a passivation film 15 and an interconnect & electrode including a drain electrode 9 and a source electrode 10 are formed by the known technique in accordance with the desired circuit system. The electrodes 9 and 10 are made of evaporated films of aluminum (Al). In order to prevent the aluminum from reacting with the PtSi layer 12, a TiW film 14 is formed in advance before the aluminum interconnection step in the contact hole portion on the PtSi film 12 by simultaneously sputtering Ti and W.

Figure 9:
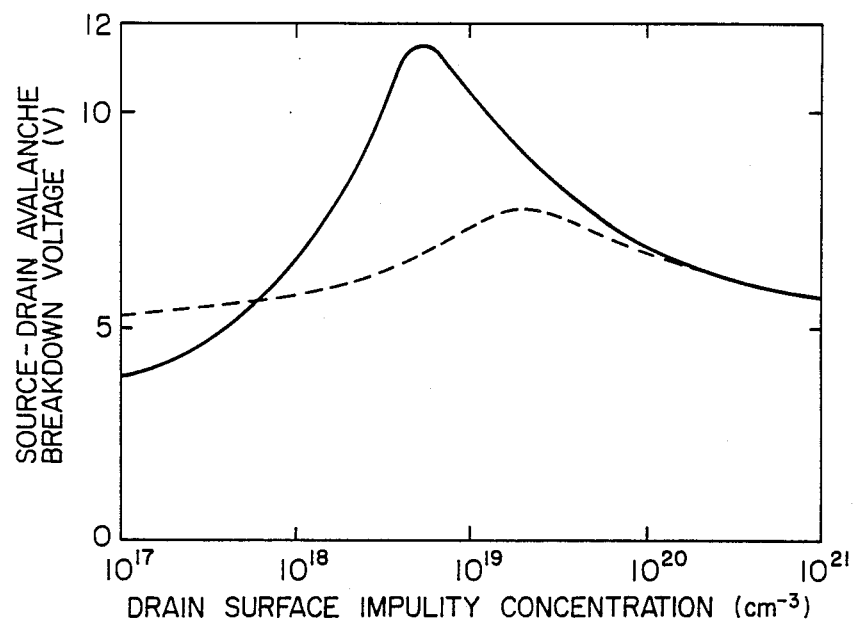
FIG. 9 is a diagram plotting the characteristics of the first embodiment of the present invention.

The source-drain breakdown voltage $BV_{DS}$ when the gate voltages of the respective MISFETs constructed of the drain diffusion layer 5 having the various surface impurity concentration $C_{s2}$ and fabricated through the above process are at zero are measured, and the measured results are plotted in FIG. 9. The respective MISFETs used for the measurements of FIG. 9 are under the same conditions as those of the effective channel length of 1 μm, the gate oxide 3 having the thickness of 20 nm and the drain junction depth of 0.25 μm, but only the surface impurity concentration of the drain diffusion layer 5 is different. In each of the MISFETs of the present embodiment, the thickness of the gate side wall oxide 11 is controlled so that the drain junction edge may align with the edge of the gate electrode 4. It is to be noted from the result of FIG. 9 that the $BV_{DS}$ value takes the maximum and reaches 11.5 V when the surface impurity concentration of the drain diffusion layer 5 is near at $5 \times 10^{18}$ cm$^{-3}$. The above-specified value indicates that the breakdown voltage can be raised by 4.5 V or more than the $BV_{DS}$ value of the prior art MISFET which is constructed of the drain having a surface impurity concentration of $10^{20}$ cm$^{-1}$ or higher and which has an equal junction depth. From FIG. 9, moreover, it is also found that the MISFET of the present invention can raise the breakdown voltage to a level higher by 3.5 V or more than the maximum of the $BV_{DS}$ value of the MISFET having the double diffused drain structure of the prior art, as indicated by a broken curve. Incidentally, the characteristics of the double-diffused drain structure shown in FIG. 9 are directed to the MISFET having such a drain diffusion layer that the low concentration distribution 5 has a junction depth $X_{j2}$ of 0.25 μm and a surface impurity concentration $C_{s2}$ of the shown values and that the high concentration distribution 7 has a junction depth $X_{j1}$ of 0.15 μm and a surface impurity concentration $C_{s1}$ of $1 \times 10^{21}$ cm$^{-3}$. Here, the gate oxide 3 has a thickness of 20 nm and an effective channel length of 1 μm.

Detailed investigation was made upon the current-voltage characteristics of the MISFET which was fabricated on the basis of the present embodiment. The investigation has revealed that neither the Schottky barrier characteristics nor a large series resistance were found in the characteristics of the current in the MISFET constructed of the drain and source diffusion layers 5 and 6 having a surface impurity concentration of $1 \times 10^{18}$ cm$^{-3}$ or more so that a good ohmic contact could be obtained between the drain and source diffusion layers 5 and 6 and the silicide 12. From the above measured results of the MISFETs fabricated o the basis of the present embodiment, it is desired from the standpoint of raising the source-drain breakdown voltage and from the standpoint of the good ohmic contact that the surface impurity concentration of the drain diffusion layer 5 be higher than $10^{18}$ cm$^{-3}$ and lower than $10^{20}$ cm$^{-3}$, preferably, about $5 \times 10^{18}$ cm$^{-3}$. In the MISFET of the present invention which is constructed of the drain diffusion layer under the above conditions, it was possible to realize the high breakdown voltage of 3.5 V or higher in terms of the $BV_{DS}$ value than that of the MISFET having the same small channel length of the prior art and to ensure the good ohmic contact. This good ohmic contact was ensured because the highly doped segregated layer 13 was formed just beneath and simultaneously with the silicide layer 12 when the layer 12 was formed on the low concentrated surface. In the MISFET constructed on the basis of the present invention, moreover, the low sheet resistance of 3 Ω/□ was ensured like the MISFET having the silicide drain structure of the prior art.

EXAMPLE 2

Figure 7:
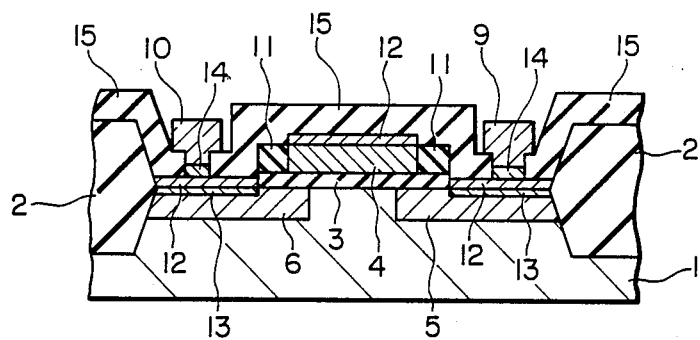
FIG. 7 is a sectional view showing a second embodiment of the present invention.

FIG. 7 is a sectional view showing another embodiment of the present invention, in which the gate side wall oxide 11 of the foregoing first embodiment is thinned so that the drain junction edge may be present beneath the gate electrode 4, thus fabricating the MISFET. In the construction described in the above, mos of the low concentrated region of the drain diffusion layer 5 can be controlled by a gate bias. Transconductances measured of the MISFETs, which were constructed according to the foregoing first embodiment and the present embodiment while sharing the structural parameters of the effective channel length of 1 μm, the source and drain junction depthes of 0.25 μm and the gate oxide of 20 nm thickness, and of the FET which was constructed of the source and drain having the highly concentrated distribution only. The measurements have revealed that the MISFETs constructed according to the first and present embodiments had normalized transconductances of 0.95 and 0.98, respectively, for the transconductance 1 of the MISFET having the construction of the prior art. The value of the transconductance of the MISFET based upon the present embodiment is concerned with the MISFET which is constructed such that about one half of the drain junction depth is covered with the gate electrode 4. As is apparent from this results of measurements, the MISFET constructed to have its drain junction covered with the gate electrode 4 could retain the transconductance similar to that of the MISFET of the conventional structure and could realize th source-drain breakdown voltage about two times as high as that of the MISFET of the conventional structure. From the standpoint of improving the transconductance, it is desired that the ratio of the low concentrated region of the drain covered with the gate electrode 4 is enlarged in the present embodiment. From the standpoint of reducing the gate capacitor, on the other hand, the ratio is desired to be small. Therefore, this ratio may be determined by the synthetic judgement concerned with the design of the integrated circuit.

EMBODIMENT 3

Figure 8:
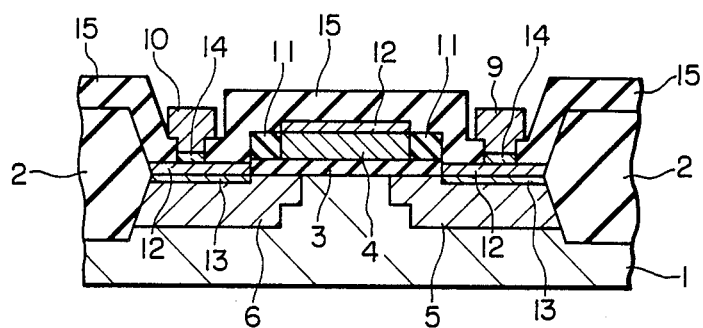
FIG. 8 is a sectional view showing a third embodiment of the present invention.

FIG. 8 is a sectional view showing still another embodiment of the present invention. In the first embodiment, the arsenic ion implantation step for forming the low concentrated drain diffusion layer was divided into two sub-steps, at which the ions were implanted with the respective energies of 70 keV and 300 keV. The subsequent steps were based upon the foregoing first embodiment until the MISFET was fabricated. The drain diffusion layer was constructed such that the maximum surface concentration of $5 \times 10^{18}$ cm$^{-3}$ was established in the substrate surface by the above-mentioned first ion implantation and such that the maximum surface concentration of $5 \times 10^{17}$ cm$^{-3}$ was established in the semiconductor substrate about 0.16 μm inside of the surface thereof by the second ion implantation. In the above MISFET, a voltage of 5 V was applied across the source and the drain, and the current to flow through the substrate 1 was measured as a function of the gate bias to take the maximum value of $1.7 \times 10^{-7}$ A. Under the same conditions as above, the substrate currents of both the MISFET having the same structural parameters as those of the MISFET of the present embodiment and based upon the foregoing first embodiment and the MISFET constructed to have the double diffused drain structure of the prior art were measured to take the maximum values of $9.6 \times 10^{-7}$ A and $1.2 \times 10^{-5}$ A, respectively. The fact that the substrate current of the MISFET based upon the present embodiment is smaller by about two orders than that of the MISFET of the conventional structure indicates that the MISFET according to the presen invention is remarkably effective for improving the reliability of the MISFET. More specifically, it is known that the reduction in the substrate current causes reduction in the injection of hot carriers into the gate oxide. This known action is coincident with the countermeasures for making the degradations of the transistor characteristics such as variations of the threshold voltage or increases in the surface face state density hard to occur. In the present embodiment, there is exemplified one example in which the drain diffusion layer 5 is formed by composing the low concentrated distributions made different by the twice ion implanting sub-steps of the different acceleration energies for the ion implantation. However, the drain diffusion layer may be composed of three or more kinds of low concentrated distributions, and the fabricating step should not be limited to the ion implantation but may resort to the known thermal diffusion process, for example. Moreover, the impurity to form the drain diffusion layer should not be identical, but its combination is arbitrary if it is such an atom as has the same conductivity type. In the conventional devices, drain high field is crowded near the surface of drain junction. The principle of the present invention is to compose an idealized drain profile which can release the highly crowded field and can distribute the high field over the drain region. In accordance with the above-specified concept, it is ideal that the drain diffusion layer 5 is constructed in its entirety such that the impurity concentration for the bias of the maximum electric field is about $1 \times 10^{18}$ cm$^{-3}$. It is desirable that the drain diffusion layer 5 is constructed by composing the impurity concentration distribution.

EMBODIMENT 4

Figure 10:
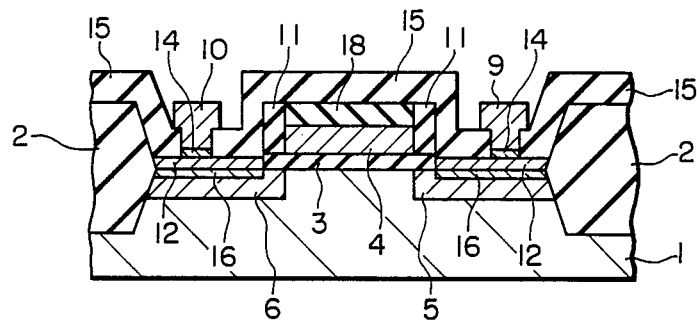
FIG. 10 is a sectional view showing a fourth embodiment of the present invention.

FIG. 10 is a sectional view showing a further embodiment of the present invention, in which the gate electrode 4 constructed of the silicon film of the foregoing first embodiment is replaced by a metal gate electrode 4 of a Mo thin film. This Mo electrode is formed on its surface with a passivation film 18 of silicon nitride in a self-alignment with the gate electrode 4. This formation is conducted by the etching process using the same photo resist. The gate structure is well known as the metal gate structure, and its detailed described will be omitted here. In accordance with the fabricating method of the well known MISFET and of the foregoing first embodiment, the low concentrated drain diffusion layer 5 and source diffusion layer 6 are formed thereon with the PtSi layer 12. After that, As ions are injected in a self-alignment relationship with the silicide layer into the portion just below the silicide layer 12. The maximum impurity concentration by the ion implantation is $1 \times 10^{21}$ cm$^{-3}$ and takes its maximum on the substrate surface. The As ion implantation is so executed by varying the acceleration energy of the ion implanter that the junction depth becomes equal to or less than 50 nm. After that, only the high concentrated region 16 is activated by the pulsed lamp anneal. After that, the passivation film 15, the drain electrode 9 and the source electrode 10 are formed in accordance with the foregoing first embodiment. Between these electrodes 9 and 10 and the silicide layer 12, there is formed the Ti-W mixed film 14 for preventing any reaction between the aluminum and the silicide in accordance with the foregoing first embodiment. The BV$_{DS}$ values were measured of the various MISFETs which has the highly concentrated region 16 having a junction depth of 10 nm to 50 nm in accordance with the above-mentioned structure. In any of the MISFETs, the BV$_{DS}$ values were lower by about 0.5 V at most than the BV$_{DS}$ value of the MISFET based upon the foregoing first embodiment. The results thus far described have revealed that the source-drain breakdown voltage can be drastically improved better than the MISFET of the prior art structure if the highly concentrated region 16 just beneath the silicide layer 12 has a thickness equal to or less than 50 nm. The principle of the present embodiment is that the high breakdown effect of the $BV_{DS}$ value is not effectively troubled while the good ohmic contact being retained if the highly concentrated region 16 formed on the surface of the drain diffusion layer 5 is remarkably thin to have a thickness of 50 nm or less in terms of the junction depth. The present embodiment presents an example in which the silicide layer 12 is formed on the drain diffusion layer 5. On the basis of the present principle, however, the silicide layer should not be limited to the platinum cilicide but may be replaced by eityher a refractory metal such as Mo, W, Pt, Pd, Ni, Ti, Ta, Nb, Cr or Pr or their silicide films.

Other Embodiments of the Invention

In all of the respective embodiments thus far described, the diffusion layers providing the source and drain regions are thin and have low impurity concentrations, and the silicide layer for reducing the resistances of the diffusion layers is formed apart (i.e., offset) from the gate electrode. As a result, the MISFET having such offset structure has its effective transconductance reduced to a lower level than that of the MISFET which has its source and drain made of highly concentrated diffusion layers. Therefore, if the gate side wall insulator (which is indicated at numeral 11 in FIGS. 6, 7, 8 and 10) is made of not the silicon oxide but a material having a higher specific dielectric constant, the influence of the gate voltage upon the surfaces of the low concentrated source and drain diffusion layers can be enhanced by the fringe capacitor (which has a wider meaning than the capacitor opposed by the faces and includes the capacitor generated at the edge, inside and end of a conductor) from the gate so that a device having a high effective transconductance can be fabricated. This discussion is also applied to the MISFET which has the source and drain of the double diffused structure shown in FIG. 1. The detailed description will be made in the following in connection with other embodiments.

EMBODIMENT 5

Figure 11:
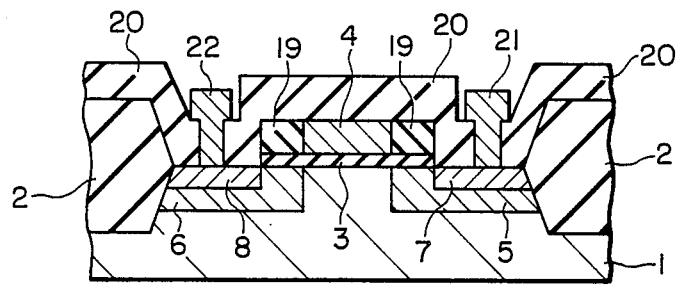
FIG. 11 is a sectional view showing a fifth embodiment of the present invention.

FIG. 11 is a sectional view showing a further embodiment of the MISFET according to the present invention. Reference numeral 1 indicates a silicon substrate of p-conductive type having a specific resistance of 1Ω·cm. Numeral 2 indicates a field oxide which is formed by the known selective oxidization and which is made thick to separate adjacent MISFETs. Numeral 3 indicates a thermally oxidized film of silicon of 20 nm. Indicated at numeral 4 is a gate electrode which is constructed of a thin silicon film which has its resistance reduced by being doped with phosphorous. After the gate electrode 4 has been formed by the known silicon gate technique, arsenic (As) ions are implated into the surface of the silicon substrate by the ion implantation using the gate electrode as a mask, and the annealing process for activating the ions implanted is conducted to form a drain diffusion layer 5 and a source diffusion layer 6. The ion implantation described in the above is performed under the condition that the impurity concentration takes its maximum of $5 \times 10^{18}$ cm$^{-2}$ on the substrate surface. After that, a silicon nitride ($Si_3N_4$) film having a relative dielectric constant of 0.6 is deposited on all the principal surface under the condition of the film thickness of 0.25 μm by the chemical vapor deposition between ammonia ($NH_3$) and monosilane ($SiH_4$). After that, by the reacting sputter etching apparatus, the aforementioned $Si_3N_4$ film is etched only by the thickness of 0.25 μm. The etching process described in the above is the so-called "anisotropic etching process" and can proceed the etching treatment only in a direction normal to the surface of the semiconductor substrate. As a result, after the etching process thus far described, a silicon nitride $Si_3N_4$ film is left only on the side wall portion of the gate electrode 4. After the side wall insulation film 19 of the $Si_3N_4$ has been formed, As ions are implanted again by using the gate electrode 4 and the side wall insulation film 19 as masks and under the condition that the maximum impurity concentration is caused on the surfaces of the source and drain diffusion layers. After that, an annealing process is conducted for the activation. The maximum surface concentration of the source and drain diffusion layers is caused to take a value of $1 \times 10^{20}$ cm$^{-3}$ or more by the second ion implantation. After that, in accordance with the ordinary order of steps of fabricating an ordinary semiconductor, a gate passivation film 20, a drain electrode 21 and a source electrode 22 are formed to fabricate a semiconductor device of the MISFETs. The MISFET fabricated according to the present embodiment had an effective channel length of 0.9 μm, and its drain diffusion layer had the low concentrated region 5 having a junction depth of 0.35 μm and the high concentrated region 7 having a junction depth of 0.15 μm. In this MISFET, the side wall insulation film 9 is constructed to cover the surface of the low concentrated region equal to or less than $10^{20}$ cm$^{-3}$ on the source and drain diffusion layers. It has been found that the transconductance of this MISFET on the basis of the present embodiment is about 1.1 times as high as that of the MISFET of the same size having its side wall insulation film made of the silicon oxide of the prior art. This difference in the transconductance is thought to come from the difference in the dielectric flux density based upon the difference in the specific dielectric constant of the insulation film 19 on the side wall of the gate electrode 4. As can also be thought, moreover specifically, in case the specific dielectric constant of the side wall insulation film 19 is 1.6 times as high as that of the gate oxide, the dielectric flux density, at which the gate field extends around the surfaces of the low concentrated regions of the source and drain diffusion layers, is higher than that in the case of the MISFET of the prior art structure, in which the specific dielectric constant of the side wall insulation film is equal to that of the gate oxide film, so that the n-type of the surface of the low concentrated region may be more accumulated to enhance the conductivity and to the breakdown voltage increase.

EXAMPLE 6

Figure 12:
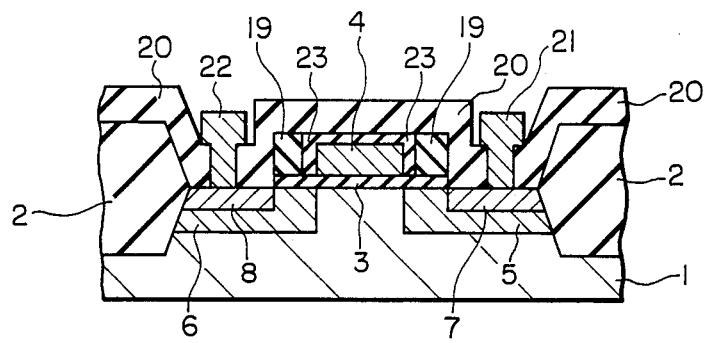
FIG. 12 is a sectional view showing a sixth embodiment of the present invention.

FIG. 12 is a sectional view showing a further embodiment of the present invention. After the drain and source diffusion layers 5 and 6 of the low impurity concentration in the foregoing fifth embodiment have been formed, the silicon gate electrode 4 is thermally oxidized on its surface to cover a silicon oxide 23 of 10 nm with the gate electrode 4. After that, a thin silicon film having a specific dielectric constant of 11 to 12 is deposited all over the surface by the chemical vapor deposition of $SiH_4$ gases. The deposited film thickness is about 0.5 μm. After that, the aforementioned thin silicon film is etched by 0.5 μm in a direction normal to the substrate surface by the use of the reacting sputter etching apparatus. As a result of the step described in the above, a silicon deposited film 19 having a width of 0.5 μm is left on the side wall of the gate electrode 4 through a thin silicon oxide 23 while being isolated from the outside. Thus, the MISFET is fabricated on the basis of the foregoing first embodiment after the etching step. The transconductance of the MISFET fabricated on the basis of the present embodiment was measured and found to reach about 1.2 times as high as that of the MISFET of the same size in which the side wall insulation film of the gate electrode was made of the silicon oxide. More notable one is that the transconductance measured again after the measurement of the static characteristics of the MISFET based upon the present embodiment further increased to reach about 1.25 times as high as that of the MISFET of the ordinary double diffused drain structure. The above-specified value is substantially equal to the transconductance of the ordinary MISFET which has the source and drain diffusion layers constructed of the highly impurity concentration distribution only. A first reason why the effective transconductance of the MISFET of the present embodiment is improved can be explained by the fact that the side wall deposited film 19 has a far larger specific dielectric constant of 12 than the value of the silicon oxide. A second reason can be explained by the fact that, when a gate voltage equal to or higher than 5 V is biased for measuring the static characteristics, the positive charges are transferred from the gate electrode through the thin oxide 13 to the silicon deposited film 19 and are stored in the film 19 so that the surface of the low concentrated regions of the source and drain diffusion layers has its conductive type strengthened to the n-type to enhance the conductivity by those positive storage charges. In other words, the silicon deposited film 19 is thought to act as the floating gate in an electrically alterable non-volatile memory. It can be executed upon the screening test, when the goods are to be selected from the MISFETs fabricated, that the silicon deposited film 19 is caused to act as the floating gate for storing the positive charges. It is, therefore, easy to inject and store the positive charges into and in the silicon deposited film 19 before the products are shipped. Incidentally, the MISFET of the present embodiment for injecting, storing and holding the positive charges in the silicon deposited film 19 also has an operation to weaken the surface field of the low concentrated region of the drain by the drain field and another operation to prevent any degradation of the MISFET based upon the injection of the hot carriers into the gate oxide by the strong drain field.

As has been described hereinbefore, the influences of the gate field through the fringe capacitor at the gate side wall can be strongly exerted upon the surfaces of the low concentrated regions of the source and drain so that the effective transconductance can be made 1.1 to 1.2 times as high as or higher than that of the existing structure.

On the basis of the fundamental concept of the present invention, the side wall deposited film should not be limited to the silicon nitride film but may be made of a dielectric material having a far higher specific dielectric constant than that of the silicon oxide such as alumina ($Al_2O_3$), tantalum oxide ($Ta_2O_5$), titanium oxide ($TiO_2$), zirconium oxide ($Zr_2O_3$) or hafnium oxide ($Hf_2O_3$).

Moreover, the effect of improving the transconductance according to the present invention may be established in the gate side wall, an insulation film, which has either the floating gate made of a semiconductor and isolated from the outside or an in the interface of the insulating films, and the side wall deposited film isolated from the outside should not be limited to the silicon but may be made of either other semiconductors, e.g., silicon carbide (SiC) or Ge, or an insulation film of silicon nitride or alumina.

Further Embodiments of the Invention

The present invention is based upon the analytical results which trace back to the physical base of the highly concentrated region in the drain diffusion layer without sticking to the existing common sense. In the MISFET having a variety of drain diffusion layer concentrations, more specifically, in case the drain diffusion layer is formed on its surface with a layer of silicide of a refractory metal there is a phenomenon that the impurity concentration of the drain diffusion layer surface is highly doped to its depth of about 10 nm as far as the drain diffusion layer is formed of an n-conductive type impurity such as phosphorous (P) or arsenic (As). In the NMOS, more specifically, there is found a fact that, if the impurity concentration of the drain diffusion layer surface is equal to or higher than $1 \times 10^{18}$ cm$^{-3}$, good ohmic characteristics are obtained between the silicide layer and the substrate surface so that no problem arises in the characteristics as the NMOS.

The drain diffusion layer in the ordinary MISFET has a highly concentrated region of $10^{20}$ cm$^{-3}$ or higher near at the semiconductor substrate surface and such an impurity concentration distribution as has its concentration decreased inwardly of the substrate in accordance with the Gaussian distribution or an error function distribution. A voltage is biased to the ordinary drain diffusion layer, and the bias field is analyzed as a function of the impurity concentration. Then, it has been found that nothing but a remarkably weak field is biased in a highly concentrated region of $10^{20}$ cm$^{-3}$ or higher. This fact has revealed that the presence of the high concentration is rather harmful from the standpoint of increasing the breakdown voltage of the sub-micron-channel-length MISFET and that the maximum impurity concentration of the drain diffusion layer is desired to be equal to or lower than $10^{19}$ cm$^{-3}$. The role of the highly concentrated region equal to or higher than the above value $10^{20}$ cm$^{-3}$ in the MISFET is to reduce the diffusion layer resistance and to ensure the good ohmic contact with the interconnect metal. The latter role, i.e., the good ohmic contact with the interconnect metal can be replaced by the structure of the drain diffusion layer having a surface impurity concentration equal to or higher than $1 \times 10^{18}$ cm$^{-3}$ and the silicide layer on the diffusion layer. As to the former role, i.e., the reduction in the source diffused resistor and the drain diffused registor, it is known to be realized by making a silicide of the surfaces of the source and drain diffusion layers. The effect of reducing the resistance by the silicide is prominent especially in the formation of an extremely shallow junction in the sub-micron-channel-length MISFET.

Therefore, the CMOSFET of the present invention develops the concept based upon the above analytical results and makes use of the results which are obtained by replacing the highly concentrated region of the drain diffusion layer by a thin silicide layer junctioned to the drain diffusion layer by the ohmic contact and by analytically determining the most proper condition for the impurity concentration of the drain diffusion layer. That most proper condition is intended to attain high breakdown voltage characteristics of the sub-micron-channel-length MISFET having a gate length of 0.5 μm or less and to protect the latch-up of the same.

Figure 13:
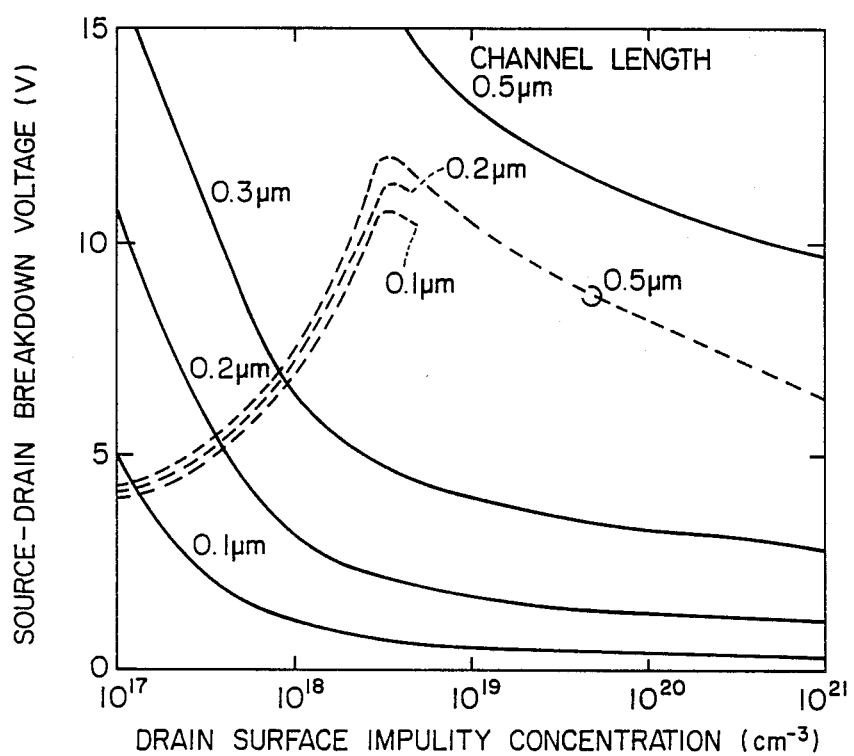
FIGS. 13 and 14 are diagrams plotting the characteristics of the seventh to ninth embodiments of the present invention.
Figure 14:
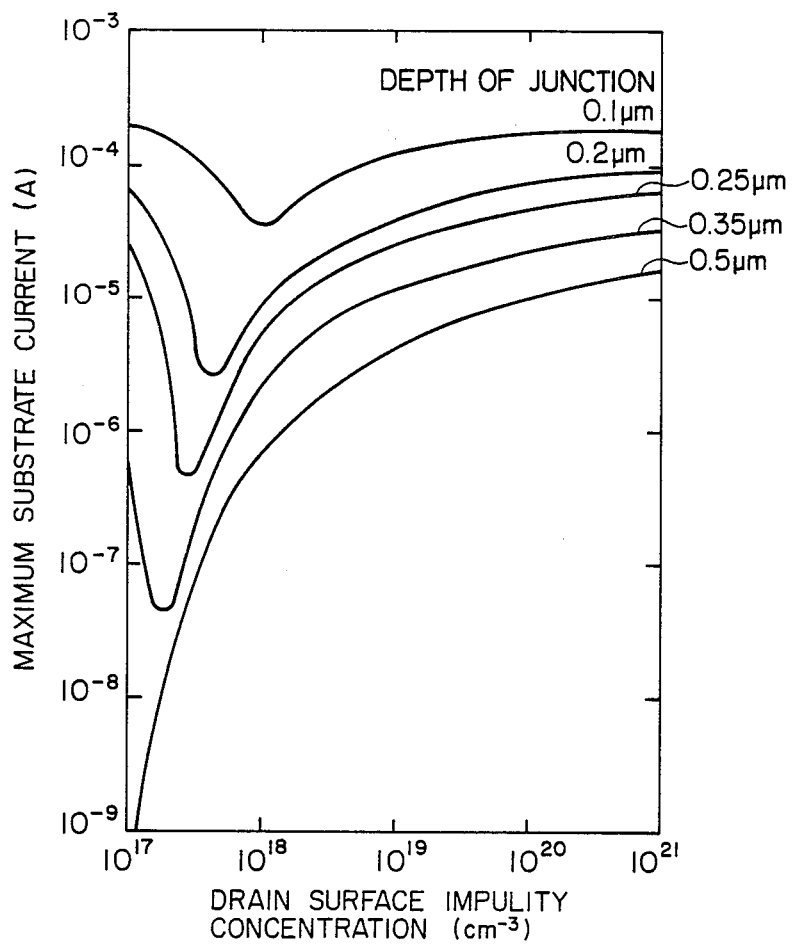

FIGS. 13 and 14 plot the respective analytical results of the present invention. There are plotted curves of the source-drain breakdown voltage and the maximum substrate current which were attained as functions of the impurity concentration of the drain diffusion layer surface. In FIG. 13, the avalanche breakdown voltage and the punch-through voltage are depicted by broken lines and solid lines, respectively, as the source-drain breakdown voltage. Those two voltages are determined as the functions of the channel length.

In FIG. 13, the avalanche breakdown voltage is concerned with the PMOS, and the values of the NMOS have a tendency that they are lower by 0.5 to 1 (V) as a whole than the shown curves. As to the punch-through voltage, on the other hand, there is found no difference between the respective values of the PMOS and NMOS.

It is newly cleared from FIG. 13 that the CMOSFET having a channel length of 0.5 μm or more is enabled to realize the breakdown voltage of 10 V or higher, which is about two times as high as the source-drain breakdown voltage in the MISFET of the ordinary structure and of the same size, if the surface impurity concentration of the drain diffusion layer is set at $3 \times 10^{18}$ cm$^{-3}$. In the MISFET having a channel length of 0.4 μm or less, moreover, the most proper surface impurity concentration of the drain diffusion layer is present in dependence upon the channel length. In the MISFET having a channel length of 0.3 μm, on the other hand, the source-drain breakdown voltage can be improved up to about 7 V if the impurity concentration of the drain diffusion layer surface is set at about $1 \times 10^{18}$ cm$^{-3}$. In the PMOS having a channel length of 0.2 μm, on the other hand, a breakdown voltage of about 5 V can be attained if the impurity concentration of the drain surface is set at $5 \times 10^{17}$ cm$^{-3}$.

In FIG. 14, the substrate current, in which the minority carriers induced by the drain current will flow to the substrate, is determined as a function of the gate bias, and its maximum value, i.e., the maximum substrate current is analyzed as a function of the impurity concentration of the drain diffusion layer surface.

In FIG. 14, as to the MISFET having a channel length of 1.0 μm and a channel width of 10 μm, the junction depth of the source and drain diffusion layers is used as a parameter, and the drain voltage is 5 V.

It is newly cleared from FIG. 14 that the substrate current can be drastically improved from that of the ordinary structure, although it depends more or less upon the drain junction depth, if surface concentration of the drain diffusion layer is set at $10^{17}$ to $10^{18}$ cm$^{-3}$, so that the protection of the latch-up phenomenon can be expected.

If a silicide layer is formed on the drain diffusion layer having the most proper surface impurity concentration for the protection of the latch-up phenomenon, the good ohmic contact is not attained, but the Schottky barrier is formed.

On the basis of both the new analytical results obtained from FIGS. 13 and 14 and the above two reference papers, the present invention has succeeded in realizing the sub-micron-channel-length CMOSFET which has such a high breakdown voltage and a latch-up protection as have never been attained. In the CMOSFET of the present invention, more specifically, the PMOS is formed of the drain junction of the Schottky barrier based upon the above two papers. For the NMOS, on the other hand, the drain junction is formed by the combination of the diffusion layer having a surface impurity concentration of $10^{18}$ cm$^{-3}$ or higher and the silicide layer having the ohmic contact on the basis of the new analytical result obtained from FIG. 13. As a result, in addition to the improvement in the latch-up protecting characteristic, the surface impurity concentrations of the respective source and drain diffusion layers of the PMOS and the NMOS can be made the most proper for the high breakdown voltage of the sub-micron-channel-length CMOSFET having a channel length of 0.5 μm or less.

EMBODIMENT 7

Figure 15:
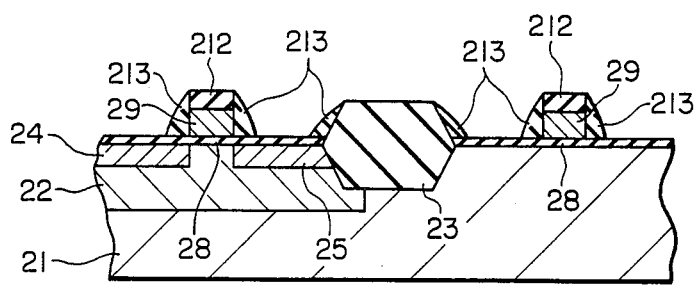
FIGS. 15 to 17 are sectional views showing the seventh embodiment of the present invention in the order of fabricating steps.
Figure 16:
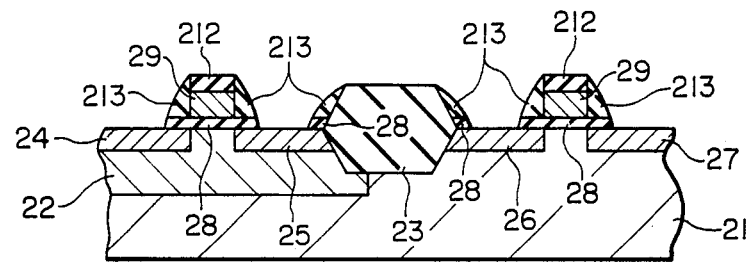
Figure 17:
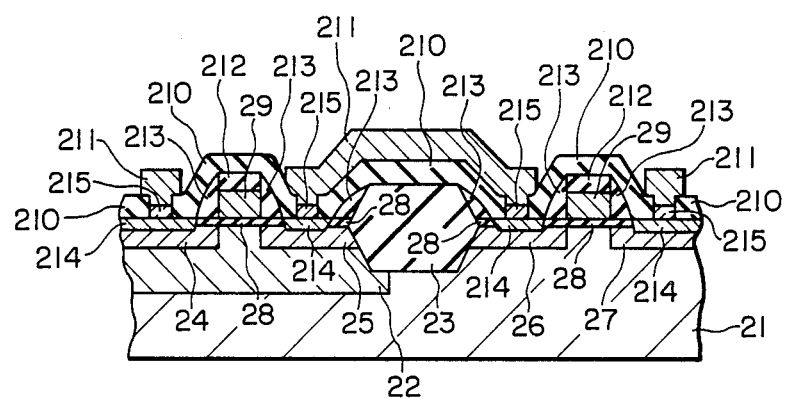

FIGS. 15, 16 and 17 are sectional views showing the fabricating steps of fabricating the CMOSFET according to the seventh embodiment of the present invention.

In FIGS. 15 to 17, reference numeral 21 indicates an n-conductive type silicon substrate having a specific resistance of 0.4Ω·cm, in which boron is diffused in a predetermined position to have a junction depth of 2 μm and a surface impurity concentration of $1 \times 10^{16}$ cm$^{-3}$ to form a p-conductive type well 22. Next, a thick field oxide 23 having a thickness of 0.5 μm is selectively formed by making use of the known isolation method. After that, the semiconductor surface in the active region is exposed to form a clean gate oxide 28 having a thickness of 20 nm. After that, a silicon film having a thickness of about 0.4 μm is formed on the gate oxide 28, and phosphorous is diffused in a high concentration into the silicon film by the thermal diffusion using POCl$_3$ as an impurity source. Next the silicon film has its surface thermally oxidized to form a silicon oxide having a thickness of 0.2 μm on the silicon film. After that, the silicon oxide and silicon film are simultaneously etched by the lithography in accordance with the desired circuit construction to leave a gate passivation film 212 and a gate electrode 29. Incidentally, five conditions of 1.0, 0.5, 0.3, 0.2 and 0.1 μm were executed as the length of the gate electrode 29, i.e., the channel length after the lithography.

After this lithography, a silicon oxide having a thickness of 0.3 μm is deposited all over the surface by the chemical vapor deposition using tetraethoxysilane (Si-(OC$_2$H$_5$)$_4$). The deposited film is etched in a direction normal to the surface of the semiconductor substrate by the reacting sputter etching process to remove the deposited film of silicon oxide on the flat portion. Then, a deposited silicon oxide 213 is left only on the respective side wall portions of the gate electrode 29 and the field oxide 23. Next, a photo resist film having a thickness of 0.8 μm is left on the gate oxide 8 excepting the region of the well 22, and arsenic ions are implanted under the condition of an acceleration energy of 70 keV. This ion implantation is under the condition in which it is conducted upon the well region 22 through the gate oxide 28 so that the maximum impurity concentration is attained on the surface of the semiconductor substrate. For the region other than the well region 22, on the other hand, the ions to be injected are blocked by the photo resist film so that they are not injected into the semiconductor substrate 21. After the ion implantation, the left photo resist film is removed. Then, the ions implated are activated and annealed to form n-conductive type source 24 and drain 25 (as shown in FIG. 15).

Incidentally, the dose of the arsenic ions is so set that the respective surface impurity concentrations of the source and drain diffusion layers 24 and 25 may take $3 \times 10^{18}$ cm$^{-3}$ in the case of a channel length of 0.5 μm or more and $1 \times 10^{18}$ cm$^{-3}$ in the case of a channel length of 0.3 μm or less. Moreover, the annealing condition is so controlled that the source diffusion layer 24 and drain diffusion layer 25 may finally have a junction depth of 0.25 μm. After the annealing process, only the well 22 is covered with the photo resist film having a thickness of 0.8 μm, and boron ions are implanted under a condition of an acceleration energy of 70 keV. By this ion implantation, the boron ions are injected into the semiconductor substrate 21 other than the well 22 through the gate oxide 28 wo that the maximum impurity concentration is located on the surface of the semiconductor substrate 21. In the well 22, the ion injection is blocked by the photo resist film so that the ions are not injected into the semiconductor substrate 21. After the ion implantation thus far described, the left photo resist film is removed, and the boron ions implanted are activated and annealed to form p-conductive type source 26 and drain 27 (as shown in FIG. 16). The dose of the boron injection is so set that the surface impurity concentrations of the source and drain diffusion layers 26 and 27 may finally fall under three kinds of conditions of $3 \times 10^{17}$ cm$^{-3}$, $1 \times 10^{18}$ cm$^{-3}$ and $3 \times 10^{18}$ cm$^{-3}$. Moreover, the annealing condition is so controlled that the junction depth of the source and drain diffusion layers 26 and 27 may finally have a junction depth of 0.25 μm. After this annealing process, the gate oxide exposed on the semiconductor substrate 21 is removed, and platinum (Pt) having a thickness of 50 nm is evaporated all over the surface by the sputter process, followed by an annealing process at 450° C. By this low temperature annealing process, a platinum silicide (PtSi) layer 214 is formed in a self-alignment on the respective surface portions of the source diffusion layers 24 and 26 and drain diffusion layers 25 and 27, to which the surface of the semiconductor substrate 21 is exposed. In the annealing process, the silicide layer 214 is not formed because the platinum (Pt) does not react on the field oxide 23, the deposited side wall oxide 213 and the passivation film 212. After the low temperature annealing process described in the above, the platinum (Pt) is etched all over the surface with aqua regia. The platinum silicide (PtSi) is not removed by the aqua regia but is left in a self-alignment only on the source diffusion layers 24 and 26 and on the drain diffusion layers 25 and 27. At this time, just beneath the platinum silicide (PtSi) layer 214 in the n-conductive type source and drain diffusion layers 24 and 25, there is formed in a self-alignment with the platinum silicide (PtSi) layer 214 a segregated layer having a thickness of about 10 mm, which has an impurity concentration higher by one order than the surface concentration before the platinum silicide layer is formed. After the formation of the platinum silicide layer 214, a silicon oxide 210 having a thickness of about 500 nm is deposited all over the surface by the chemical vapor deposition of monosilane (SiH$_4$) and oxygen (O$_2$), and the silicon oxide 210 is selectively removed by the lithography from such portions of the source diffusion layers 24 and 26 and the drain diffusion layers 25 and 27 as are to be formed with contact holes. After the silicon oxide 210 has been selectively removed, the whole surface is coated with a TiW film 215 by simultaneously sputtering titanium (Ti) and tungsten (W) while leaving the photo resist film, which has been used at the above step, as it is. After that, the photo resist film is removed. At this step, moreover, the TiW film on the photo resist film is removed together so that the TiW film 215 is left selectively only on the region from which the silicon oxide 210 has been removed. Finally, an interconnect 211 of aluminum (Al) is formed in accordance with the desired circuit construction (as shown in FIG. 17).

Incidentally, the TiW film 215 is necessary for preventing any reaction between the aluminum interconnect 211 and the silicide layer 214.

Next, the following results were attained by measuring the breakdown voltages between the source and drain diffusion layers as to the CMOSFET which was fabricated by the steps described in the above. More specifically, the PMOS, in which the surface impurity concentrations of the respective source and drain diffusion layers 26 and 27 of the p-conductive type were set at $3 \times 10^{17}$ cm$^{-3}$, exhibited the Schottky characteristics, but the MOSFET having a channel length of 0.2 μm or more could attain a breakdown voltage of about 5 V. This value is two times as high as or higher than that of the MOSFET of the prior art structure having a p-conductive type drain surface impurity concentration of $10^{19}$ cm$^{-3}$ or higher. The PMOS having a p-conductive type drain surface impurity concentration set at $1 \times 10^{18}$ cm$^{-3}$ exhibited the transistor characteristics based upon the p+n junction, and its source-drain breakdown voltage was 6.5 to 7 V for the MOSFET having a channel length of 0.3 μm or more. That voltage value is 1.6 to 1.7 times as high as that of the prior art and indicates that the high breakdown effect could be realized. Moreover, the PMOS having the p-conductive type drain surface impurity concentration set at $3 \times 10^{18}$ cm$^{-3}$ also exhibited the transistor characteristics based upon the p+n junction, and its source-drain breakdown voltage was about 12 V for the MOSFET having a channel length of 0.5 μm or more. That voltage value is higher by 2 V or more than that of the prior art and indicates that the high breakdown effect could be realized.

In the NMOS in which the surface impurity concentration in the respective n-conductive type source and drain diffusion layers 24 and 25 was set at $3 \times 10^{18}$ cm$^{-3}$, the MOSFET having a channel length of 0.5 μm or more had a source-drain breakdown voltage of about 10 V. This value is about two times as high as that of the prior art, and the breakdown voltage is raised. In the NMOS in which the drain surface impurity concentration set at $1 \times 10^{18}$ cm$^{-3}$, too, good ohmic characteristics could be retained between the source and drain diffusion layers 24 and 25 and the silicide layer 214, and the transistor characteristics based upon the n+p junction were obtained. The source-drain breakdown voltage was so dependent upon the channel length such that it took about 6 V for the MOSFET having the channel length of 0.3 μm and about 3 V for the MOSFET having the channel length of 0.2 μm. These voltage values are two times as high as or higher than the source-drain breakdown voltage of the NMOS of the piror art structure and raise the breakdown voltage.

The source-drain breakdown voltages of the NMOS and the PMOS of the CMOSFET based upon the present embodiment are remarkably identical to the analytical results shown in FIG. 13 so that the validity of the analysis has been verified. According to the present embodiment, more specifically, the source-drain breakdown voltage of the sub-micron-channel-length CMSOFET having a channel length of 0.5 μm or less could be improved to a value twice as high as that of the prior art. The MOSFET is completed in accordance with the present embodiment by setting the surface impurity concentration of the respective source and drain diffusion layers of the NMOS and the PMOS at $3 \times 10^{18}$ cm$^{-3}$, in the case of the CMOSFET having the channel length of 0.5 μm, or more, and at $1 \times 10^{18}$ cm$^{-3}$ in the case of the CMOSFET having the channel length of 0.3 μm. Then, it is possible to fabricate the sub-micron-channel-length CMOSFET having the high breakdown voltages of 10 V and 6 V, respectively. In the case of the channel length of 0.2 μm, on the other hand, the MOSFET is completed in accordance with the present embodiment by setting the surface impurity concentrations of the source and drain diffusion layers of the PMOS and the NMOS, respectively, at $3 \times 10^{17}$ cm$^{-3}$ and $1 \times 10^{18}$ cm$^{-3}$. Then, it is possible to attain the sub-micron-channel-length CMOSFET having the source-drain breakdown voltage of 3 V. In the MOSFET described in the above, there is formed between the source and drain diffusion layers 26 and 27 of the PMOS and the silicide layer 214 the Schottky barrier which raises no problem in the characteristics. That Schottky barrier rather has a function to improve the latch-up protecting characteristics.

Next, the latch-up protecting characteristics are evaluated as to the CMOSFET which has been fabricated by the steps described in the present embodiment. The following items are measured as the latch-up protecting characteristics. Specifically, the product $\beta_N \cdot \beta_P$ of the current gain $\beta_N$ of a parasitic NPN bipolar transistor, which used the drain diffusion layer 25 of the NMOS as its emitter, the well 22 as its base, and the semiconductor substrate 21 as its collector, and the current gain $\beta_P$ of a parasitic PNP transistor which used the source diffusion layer 26 of the PMOS as its emitter, the semiconductor substrate 21 as its base, and the well 22 as its collector, was measured. In this measurement, a voltage of 5 V was applied across the base and the collector, and the product $\beta_N \cdot \beta_P$ was determined as a function of the emitter current within a range of $10^{-6}$ to $10^{-2}$ A. As a result, the respective products $\beta_N \cdot \beta_P$ of the CMOSFET, in which the respective drain surface impurity concentrations of the PMOS and the NMOS were $3 \times 10^{18}$ cm$^{-3}$ and in which the channel length was 0.5 μm, the CMOSFET, in which the respective drain surface impurity concentrations were $1 \times 10^{18}$ cm$^{-3}$ and in which the channel length was 0.3 μm, and the CMOSFET, in which the drain surface impurity concentration of the PMOS and the same surface impurity concentration of the NMOS were $3 \times 10^{17}$ cm$^{-3}$ and $1 \times 10^{18}$ cm$^{-3}$, respectively, and in which the channel length was 0.2 μm, took their maximums within a range of $10^{-2}$ to $10^{-4}$. Those maximums do not satisfy the condition of $\beta_N \cdot \beta_P > 1$, under which the latch-up can take place, but are substantially equal to or smaller than the value of $10^{-2}$ of the product $\beta_N \cdot \beta_P$ of the CMOSFET which is constructed such that the drain diffusion layer of the PMOS is made of the Schottky junction whereas the drain diffusion layer of the NMOS is made of the ordinary n+p junction having a high impurity concentration. From the results thus far described, it can be concluded that, in the CMOSFET having its PMOS drain diffusion layer set at a low impurity concentration, the most proper condition of the drain surface impurity concentration of the NMOS may be set in accordance with the desired channel length not from the standpoint of protecting the latch-up but rather from the standpoint of improving the source-drain breakdown voltage.

Next, together with the CMOSFET according to the present embodiment, the CMOSFET, which had the respective NMOS and PMOS drain surface impurity concentrations set at $5 \times 10^{18}$ and $10^{20}$ cm$^{-3}$ and which had a channel length of 0.2 to 1.0 μm, was fabricated, and its source-drain breakdown voltages and latch-up protecting characteristics were measured. The source-drain breakdown voltage of the above-specified CMOSFET was improved by several volts at the maximum from the value of the prior art, and the product $\beta_N \cdot \beta_P$ was smaller than 1, but the characteristics were slightly inferior to those of the aforementioned results.

EMBODIMENT 8

Figure 18:
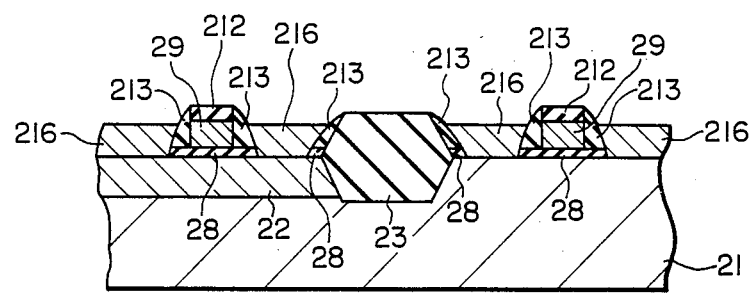
FIGS. 18 and 19 are sectional views showing the eighth embodiment of the present invention in the order of fabricating steps.
Figure 19:
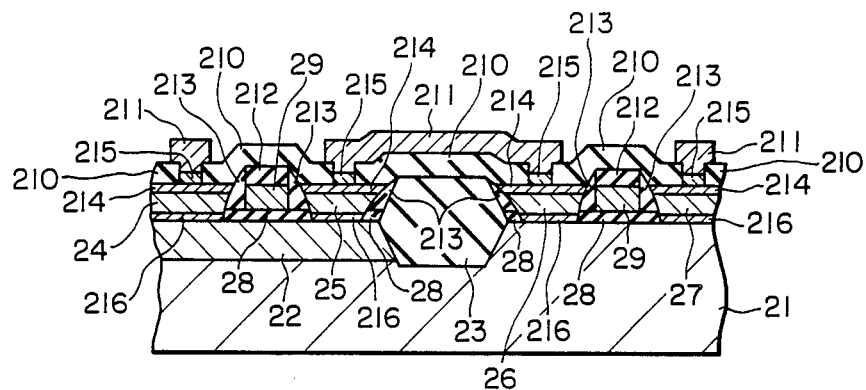

FIGS. 18 and 19 are sectional views showing the steps of fabricating the CMOSFET according to the eighth embodiment of the present invention.

In the foregoing seventh embodiment shown in FIG. 15, the deposited silicon oxide 213 is left in self-alignment only on the side walls of the gate electrode 29 and the field oxide 23, and the exposed gate oxide is completely removed. Next, a chemical vapor deposition of dichlorosilane (SiH$_2$Cl$_2$) and hydrochloric acid (HCl) is conducted at a temperature of 775° C. to deposit the polycrystal line or amorphous thin silicon film 16 having a thickness of 0.3 μm selectively on the surfaces of the well 22 and the semiconductor substrate 21 held in the n-type conductivity (as shown in FIG. 18). The forming condition of the deposited silicon film is exemplified by the deposition rate of 10 nm/minute for 200 cc of dichlorosilane and 60 cc of hydrochloric acid. Under this condition, so long as the silicon nitride film (Si$_3$N$_4$) is not present on the surface of the deposited film, the deposition is selectively effected on the silicon substrate only, and a smooth flat shape can be obtained even at the boundary with the side wall insulation film 13.

After the deposition of the thin silicon film 216, the photo resist film is so selectively formed that an ion implantation may be effected only at the thin silicon film of the well 22, and a boron ion implantation is executed. The dose of the boron injection is so set that the impurity concentration in the thin silicon film 216 may coincide with that on the surface of the well 22. The implanting energy is 25 keV. After that, the photo resist film used as the mask for the ion implantation is removed, and a high temperature annealing process at 1,150° C. and for 15 seconds is executed to activate the ions injected and to effect single crystalization of the thin silicon film 216. The coefficient of diffusion of an impurity in the thin silicon film 126, which has been made in advance of a polycrystalline or amorphous material, is 10 to 20 times as large as that in the single crystalline silicon. As a result, the boron ions injected into the thin silicon film 216 on the well 22 are distributed substantially uniformly in the depthwise direction within the thin silicon film 216 by the short annealing process. After this annealing process, in accordance with the foregoing seventh embodiment, the n-conductive type source and drain diffusion layers 24 and 25 and the p-conductive type source and drain diffusion regions 26 and 27 are formed. The thin silicon film 216 has already been made into a single crystal by the short time and high temprature annealing process. Therefore, the conditions for forming the respective source and drain diffusion layers are the same as those in the case of the foregoing seventh embodiment. After that, the CMOSFET is fabricated in accordance with the seventh embodiment (as shown in FIG. 19).

The CMOSFET based upon the eighth embodiment shown in FIG. 19 has the same size as that of the CMOSFET based upon the foregoing seventh embodiment. The source-drain breakdown voltages of the two CMOSFETs were compared to reveal that the CMOSFET of the eighth embodiment under the conditions of the channel length of 0.3 $\mu$m and the source and drain surface impurity concentrations of $1 \times 10^{18}$ cm$^{-3}$ had a breakdown voltage of 7 V which was higher by about 1 V than that of the CMOSFET of the foregoing seventh embodiment. Moreover, the breakdown voltage of the CMOSFET of the eighth embodiment, which was constructed under the conditions of the channel length of 0.2 $\mu$m and the NMOS and PMOS drain surface impurity concentrations of $1 \times 10^{18}$ cm$^{-3}$ and $3 \times 10^{17}$ cm$^{-3}$, was measured and compared with that of the CMOSFET of the foregoing seventh embodiment. Then, the former breakdown voltage was higher by about 2 V and took a value of 5 V. This value implies that the breakdown voltage was realized to be three times or more as high as the source-drain breakdown voltage of the CMOSFET based upon the prior art structure. In the CMOSFET based upon the eighth embodiment, the product $\beta_N \cdot \beta_P$ of the current gains of the parasitic bipolar transistor was measured in case the channel length had various values and the source-drain surface impurity concentration had various values, and that product was reduced two seconds to one-half of the measured value of the CMOSFET based upon the foregoing seventh embodiment. Thus, the CMOSFET based upon the eighth embodiment is improved better in the source-drain breakdown voltage and in the latch-up protecting characteristics than the CMOSFET based upon the seventh embodiment. The reason for this improvement can be explained by the fact that the junction area was decreased but the effective channel length was increased by forming the respective source and drain junctions in the thin semiconductor film 216.

EMBODIMENT 9

Figure 20:
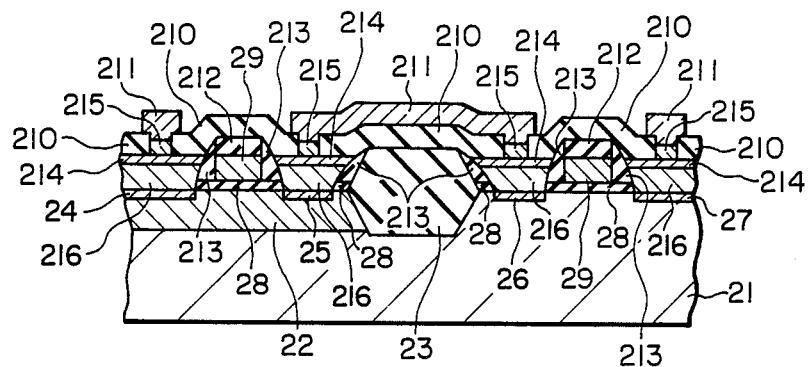
FIG. 20 is a sectional view showing the ninth embodiment of the present invention.
Figure 21:
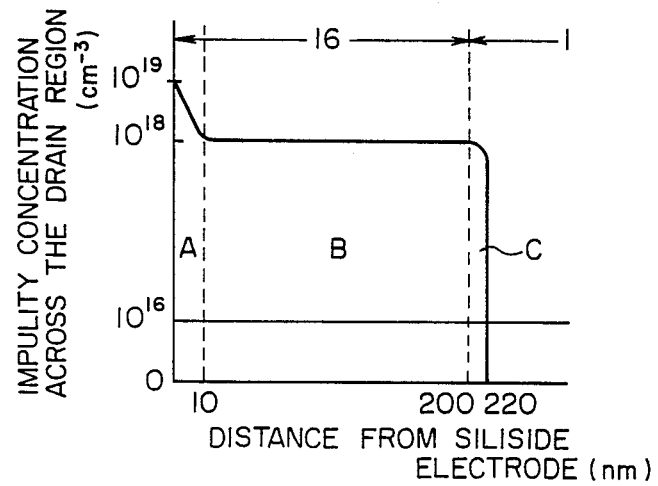
FIG. 21 is a diagram plotting the impurity concentration in the depthwise direction of the drain of the ninth embodiment of the present invention.

FIGS. 20 and 21 are a sectional view showing the CMOSFET according to the ninth embodiment of the present invention and a diagram plotting the impurity concentration distribution in the depthwise direction in the n-conductive type drain diffusion region.

In the eighth embodiment shown in FIG. 18, the polycrystalline or amorphous silicon film 216 is deposited in self-alignment on the semiconductor substrate 21. After that, a photo resist film is so left on the surface of the region other than the silicon film 216 that the ion implantation may be effected only on the portion of the silicon film of the well 22. After that, arsenic ions are implanted in the portion of the silicon film on the well 22, and the left photo resist film is then removed.

Next, the well 22 is covered with the photo resist film, and this photo resist film is left again so that the ion implantation may be effected only on the silicon film on the semiconductor substrate 21 of n-conductive typ other than the well 22. After that, borom ions are implanted, and the photo resist film is removed again completely to expose the silicon film 216. In this state, the short time and high temperature annealing process is executed at 1,100° C. for 30 seconds. Even with this annealing process under the specified conditions, the silicon film 216 is not made into a single crystal but is held in its polycrystalline or amorphous state. Since the coefficient of diffusion of the impurity in the polycrystalline or amorphous silicon film 216 has such a remarkably large value as has been described hereinbefore, the arsenic and boron ions are distributed at a high speed to take a uniform concentration in the silicon film 216 by the above-specified short time annealing process. However, the coefficient of diffusion of each impurity in the semiconductor substrate 21 is relatively small so that the impurities are diffused by about 20 nm at most within the semiconductor substrate 1 even by the short time annealing process.

Figure 2A:
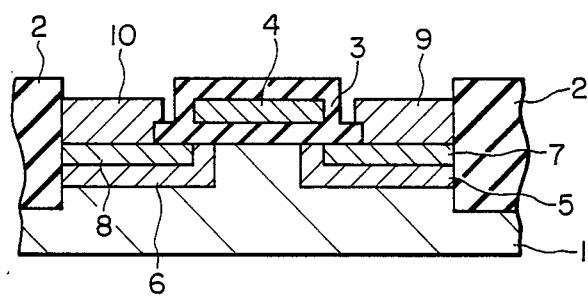
FIG. 2A is a sectional view showing the MISFET having the double diffused drain structure of the prior art.
Figure 2B:
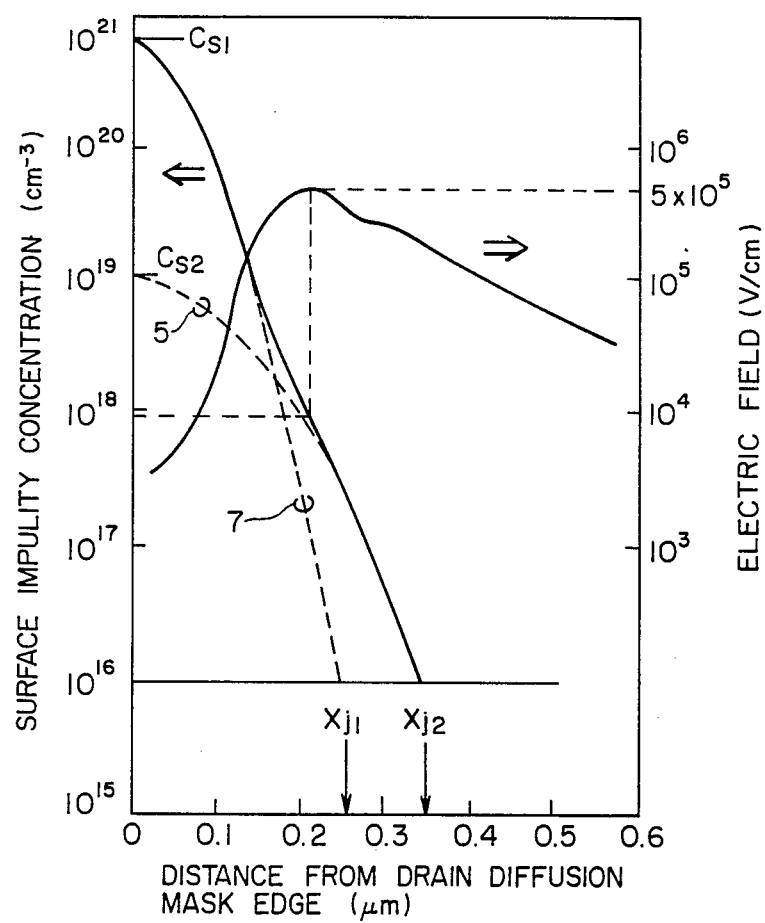
FIG. 2B is a diagram plotting the analyses of both the impurity concentration and the electric field on the substrate surface of the MISFET of FIG. 2A.
Figure 3:
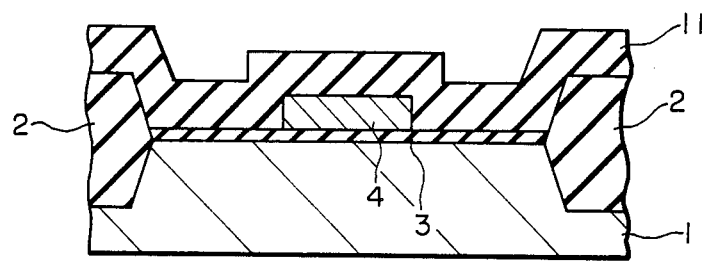
FIGS. 3 to 6 are sectional views showing the fabricating steps in the consecutive order in accordance with a first embodiment of the present invention.

Thus, by the implantation of the arsenic and boron ions and by the subsequent short time annealing process, the silicon film 216, the well 22 and the n-conductive type semiconductor substrate 21 are formed therein with the n-conductive type source and drain diffusion layers 24 and 25 and the p-conductive type source and drain diffusion layers 26 and 27, respectively. After that, the platinum silicide (PtSi) layer 214 is formed in self-alignment on the source diffusion layers 24 and 26 and drain diffusion layer 25. By executing the subsequent steps in accordance with the seventh embodiment, the CMOSFET shown in FIG. 2 can be fabricated.

The impurity concentration distributions of the n-conductive type source and drain diffusion layers 24 and 25 of the CMOSFET according to the ninth embodiment are divided, as shown in FIG. 21, into three regions A, B and C, i.e., an impurity segregated region A having a thickness of about 10 nm and lying just beneath the silicide layer 214, a uniform distribution region B inside of the silicon film 216, and a steep concentration distribution region C having a junction depth of about 20 nm in the well 22. The impurity segregated region A is not found in the p-conductive type source and drain diffusion layers 26 and 27.

In the CMOSFET according to the ninth embodiment, the MOSFET was fabricated by setting the dose of the arsenic or boron implantation such that the uniform distribution concentration in the silicon film 216 might take the respective values of $1 \times 10^{18}$ cm$^{-3}$, $3 \times 10^{18}$ cm$^{-3}$, $10^{19}$ cm$^{-3}$ and $5 \times 10^{19}$ cm$^{-3}$ for the NMOS and the respective values of $1 \times 10^{17}$ cm$^{-3}$, $3 \times 10^{17}$ cm$^{-3}$, $1 \times 10^{18}$ cm$^{-3}$, $3 \times 10^{18}$ cm$^{-3}$ and $5 \times 10^{18}$ cm$^{-3}$ for the PMOS. On the other hand, the MOSFET was fabricated in case the channel length took the respective values of 0.1, 0.2, 0.3, 0.5 and 1.0 $\mu$m. As to the various CMOSFETs thus far described, the source-drain breakdown voltages and the product $\beta_N \cdot \beta_P$ of the respective current gains of the parasitic bipolar transistors were measured. In case the uniformly distributed impurity concentration in the drain diffusion layer 27 of the NMOS was equal to or more than $10^{19}$ cm$^{-3}$, the improvement in the characteristics were not found. In case the uniformly distributed impurity concentration was set at a low value of $10^{17}$ to $10^{19}$ cm$^{-3}$, the improvement especially in the source-drain breakdown voltage was prominent. In case the uniformly distributed impurity concentration in the drain diffusion layer was $1 \times 10^{18}$ cm$^{-3}$, the source-drain breakdown voltage of the respective CMOSFETs having channel lengthes of 0.1 and 0.2 $\mu$m reached as high as 4.5 and 8 V, respectively. These values were drastically improved better than those of the case of the CMOSFET based upon the eighth embodiment. This effect was relatively prominent in the case of the smaller channel length. In case the uniformly distributed impurity concentration in the drain diffusion layer 25 in the PMOS was lower than $10^{17}$ to $10^{18}$ cm$^{-3}$ and the gate length was 0.1 μm, the source-drain breakdown voltage was improved by several volts better than that in the case of the eighth embodiment to reach 5 V or higher.

The different in the effect between the ninth and eighth embodiments can be explained to come from the fact that the low concentrated region to be biased with the maximum drain field is formed substantially uniformly in the silicon film 216, as shown in FIG. 21, in the case of the ninth embodiment so that the release effect of the field crowding becomes prominent.

The impurity concentration distribution shown in FIG. 21 is intrinsic to the case in which the silicon film 216 is made of a polycrystalline or amorphous material. This construction remarkably enhances the source-drain breakdown voltage of the sub-micro-channel-length CMOSFET.

On the other hand, the product $\beta_N \cdot \beta_P$ of the parasitic bipolar transistors of the sub-micro-channel-length CMOSFET based upon the ninth embodiment was not substantially different from that of the case of the eighth embodiment, and the latch-up phenomenon was negligible.

In the embodiments, shown in FIGS. 19, and 20 the surface conductivity beneath the side wall insulator 213 might be controlled, if desirable, by the way of ion implantation technique before forming side wall insulators.

EFFECTS OF THE INVENTION

According to the first to sixth embodiments of the present invention, the position of the maximum field can be widely dispersed within the drain diffusion layer so that the source-drain breakdown voltage can be improved by 5 V or more better than that of the transistor of the prior art structure having the same structural parameters. As a result, according to the present invention, the transistor of miniaturized structure having an effective channel length of 0.5 μm or less can be operated without any change such as a drop of the power supply voltage from 5 V to 3 V or lower.

In the first to third embodiments of the present invention, the impurity concentration region necessary for the ohmic contact is constructed in self-alignment with the PtSi layer by making use of the segregation effect of the impurity just beneath the PtSi layer when this layer is to be formed. This PtSi layer may be replaced by another refractory metal such as Mo, W, Pd, Ni, Ti, Ta, Nb, Cr or Pr or their silicide film. In the respective embodiments of the present invention, moreover, the source-drain diffusion layers were made of the As ions, for example, but may be made of P ions. Moreover, the method of forming the diffusion layers should not be limited to the ion implantation but may resort to another known method such as the thermal diffusion method without departing from the spirit of the present invention. Still moreover, the present invention should not be limited to the single transistor thus far described but can also be applied to a semiconductor integrated circuit device.

Moreover, the effects of the seventh to ninth embodiments are obtained by improving the regions corresponding to the source and drain of the existing structure. But, the breakdown voltage is not raised by increasing the concentration of the semiconductor substrate 21. As a result, the mobility is neither degraded on the basis of the increase in the substrate doping concentration, nor is degraded the high speed operation.

According to the seventh to ninth embodiments of the present invention, the refractory metal or its silicide layer is formed on the source and drain diffusion layers. As a result, the sub-micron-channel-length CMOSFET can retain its sheet resistance at a low level, e.g., at several Ω/□ so that the high speed operation can be ensured.

The foregoing descriptions of the respective seventh to ninth embodiments are directed to the case in which the maximum impurity concentrations of the source and drain diffusion layers are equal to or higher than $1 \times 10^{17}$ cm$^{-3}$. The descriptions are based upon the analytical results of FIG. 13, i.e., those of the gate length of 0.1 μm. This value is the minimum gate length to be realized. In case the present invention is applied to the above impurity concentration (i.e., $1 \times 10^{17}$ cm$^{-3}$) or less, on the other hand, the substrate current and the drain leakage current are increased, as can be deduced from FIG. 14.

In the respective seventh to ninth embodiments, moreover, the platinum silicide (PtSi) layer was formed in self-alignment on the source and drain diffusion layers. The PtSi layer was presented, by way of example, and can be replaced by a refractory metal, e.g., Mo, W, Pd, Ni, Ti, Ta, Nb, Cr or Pr or their silicide film. In the respective embodiments, furthermore, the description has been directed to the method by which a hot temperature furnace was used for the short time annealing process. However, this step may resort to another method such as a lamped annealing process or a laser or electron beam radiation process. Further, the descriptions of the respective embodiments are directed to the case in which the p-conductive type well is used. On the contrary, the present invention can be applied to the CMOSFET of the structure in which the n-conductive type well is formed in the p-conductive type semiconductor substrate.

As has been described hereinbefore, according to the present invention, it is possible to realize a sub-micron-channel-length CMOSFET which can be operated even with the ordinary power supply of 5 V, while protecting the latch-up phenomenon but not degrading the high speed operation, even in a short channel length of 0.2 μm.

What is claimed is:

1. A semiconductor device comprising:
    a semiconductor region of a first conductivity type;
    a source region and a drain region, each of a second conductivity type which is opposite to said first conductivity type, separately disposed in said semiconductor region of the first conductivity type and spaced from the surface thereof, the maximum surface impurity concentration in at least one of said source region and said drain region being equal to or higher than $10^{18}$ cm$^{-3}$ but lower than $10^{20}$ cm$^{-3}$;
    first and second conductive layers comprised of a material selected from a group consisting of a refractory metal and a silicide of said refractory metal, located on said semiconductor region respectively over the source and drain regions;
    at least one high impurity concentration semiconductor layer in said semiconductor region, extending to the surface of said semiconductor region, respectively extending between at least one of the source and drain regions and at least one of the first and second conductive layers, and ensuring ohmic contact between the respective at least one source and drain region and at least one first and second coductive layer, said at least one high impurity concentration semiconductor layer being of said second conductivity type and being a higher impurity concentration than that of the respective source or drain region, said at least one high impurity concentration semiconductor layer having a thickness not exceeding 50 nm; and a gate means on a region of said semiconductor region of a first conductivity type between said source region and said drain region, whereby said at least one of the source and drain regions having said maximum surface impurity concentration, together with said first and second conductive layers and the at least one high impurity concentration semiconductor layer having said thickness, can provide good ohmic contact while providing a high breakdown voltage between the source and drain regions.

2. A semiconductor device as set forth in claim 1, characterized in that said first and second conductive layers are made of only said refractory metal or its silicide.

3. A semiconductor device as set forth in claim 1, characterized in that said drain or source region extends to a location beneath said gate means.

4. A semiconductor device as set forth in claim 3, characterized in that said gate means is made of a thin film of molybdenum or silicon.

5. A semiconductor device as set forth in claim 3, characterized in that a gate side wall insulator having a higher specific dielectric constant than that of silicon oxide is formed on the side wall of said gate means.

6. A semiconductor device as set forth in claim 5, characterized in that said side wall insulator is made of a silicon nitride film.

7. A semiconductor device as set forth in claim 1, characterized in that said gate means comprises an insulator layer on said semiconductor region of first conductivity type, between said source region and drain region, and a gate electrode on said insulator layer.

8. A semiconductor device as set forth in claim 1, characterized in that a length between said source region and said drain region is 1 $\mu$m or less.

9. A semiconductor device as set forth in claim 1, characterized in that a length between said source region and said drain region is 0.5 $\mu$m or less.

10. A semiconductor device as set forth in claim 1, characterized in that said refractory metal is a metal selected from the group consisting of Pt, Mo, W, Pd, Ni, Ti, Ta, Nb, Cr and Pr.

11. A semiconductor device as set forth in claim 1, characterized in that the gate means comprises an insulator layer formed on said semiconductor region of first conductivity type and a gate electrode formed on said insulator layer; and in that a semiconductor film is formed on said semiconductor region of first conductivity type, said film extending down to a level substantially the same as the bottom surface of the insulator layer.

12. A semiconductor device as set forth in claim 1, characterized in that the gate means comprises an insulator layer formed on said semiconductor region of first conductivity type and a gate electrode formed on said insulator layer; and in that a semiconductor film is formed on the semiconductor region of first conductivity type, said film extending down to a level lower than the botton surface of said insulator layer.

13. A semiconductor device as set forth in claim 1, characterized in that at least one of the source and drain regions are regions formed by at least two introductions of impurities, with a first, relatively shallow region having said maximum surface impurity concentration and at least one deeper region having a relatively low impurity concentration.

14. A semiconductor device as set forth in claim 1, characterized in that a side wall insulator is disposed at respective sides of the gate means, said side wall insulator comprising an oxide film at the side of the gate means and a semiconductor film at the side of the oxide film not adjacent the gate means.

15. A semiconductor device as set forth in claim 5, characterized in that said gate side wall insulator is made of a material selected from the group consisting of alumina, tantalum oxide, titanium oxide, zirconium oxide and hafnium oxide.

16. A semiconductor device having at least first and second field effect transistors:

said first field effect transistor having:

a p-type semiconductor region;

an n-type source region and an n-type drain region, having a maximum surface impurity concentration of $10^{18}$ but lower than $10^{20}$ cm$^{-3}$, formed spaced apart from each other in said p-type semiconductor region, the source and drain regions being spaced from the surface of the p-type semiconductor region;

first and second conductive layers disposed on said n-type source region and said n-type drain region respectively;

at least one of said first and second conductive layers being of a material selected from the group consisting of a refractory metal and silicide of said refractory metal;

at least one high impurity concentration semiconductor layer in said p-type semiconductor region and extending to the surface thereof, respectively extending between at least one of the source and drain regions and said at least one of the first and second conductive layers, and ensuring ohmic contact between said at least one of the n-type source and n-type drain regions and said at least one of the first and second conductive layers, the at least one high impurity concentration semiconductor layer being of n-type conductivity and having a higher impurity concentration than that of the respective n-type source region or n-type drain region, the at least one high impurity concentration semiconductor layer having a thickness not exceeding 50 nm; and first gate means on a first channel region defined between said n-type source region and said n-type drain region;

said second field effect transistor having;

an n-type semiconductor region;

a p-type source region and a p-type drain region, having a maximum surface impurity concentration of $10^{17}$ to $10^{19}$ cm$^{-3}$, formed spaced from each other in said n-type semiconductor region;

third and fourth conductive layers disposed on said p-type source region and said p-type drain region, respectively; and second gate means on a second channel region defined between said p-type source region and said p-type drain region.

17. A semiconductor device as set forth in claim 16, characterized in that said n-type drain or source region is composed, in a direction extending away from the first and second conductive layers, of three impurity concentration distribution regions, an impurity segregated region just beneath said layer of the refractory metal or its silicide, a substantially uniformly distributed region in a thin silicon film, and a region having a steep concentration distribution.

18. A semiconductor device as set forth in claim 16, wherein said first and second gate means each comprise:
an insulator layer on said semiconductor region having a first conductivity type, between the respective source region and said drain region;
a gate electrode on said insulator layer; and
an insulator layer disposed on both sides of the gate electrode.

19. A semiconductor device as set forth in claim 18, characterized in that one portion of said drain or source region is made of a thin film of polycrystalline or amorphous material.

20. A semiconductor device as set forth in claim 16, characterized in that the first and second field effect transistors are formed in a single semiconductor member, with one of said p-type semiconductor region and said n-type semiconductor region being the semiconductor member, and the other of said p-type semiconductor region and said n-type semiconductor region being a well formed in the semiconductor member, thereby to provide a CMOSFET.

21. A semiconductor device comprising:
a semiconductor region of a first conductivity type;
a source region and a drain region, each of a second conductivity type which is opposite to said first conductivity type, separately disposed in said semiconductor region of the first conductivity type and spaced from the surface thereof, the maximum surface impurity concentration in at least one of said source region and said drain region being equal to or higher than $10^{18}$ cm$^{-3}$ but lower than $10^{20}$ cm$^{-3}$;
first and second conductive layers of a material selected from a group consisting of a refractory metal and a silicide of said refractory metal, disposed respectively on the source and drain regions;
first and second segregated layers, of said second conductivity type, having a higher impurity concentration than that of the respective source region or drain region and having a thickness not exceeding 50 nm, extending in said semiconductor region of a first conductivity type to the surface thereof, respectively between the source and drain regions and the first and second conductive layers; and
a gate means on a region of said semiconductor region of a first conductivity type between said source region and said drain region.

22. A semiconductor device as set forth in claim 21, characterized in that said first and second segregated layers have an impurity concentration that is an order of magnitude greater than that of the source and drain regions.

* * * * *